(12) United States Patent
Schuster et al.

(10) Patent No.: US 11,536,692 B2
(45) Date of Patent: Dec. 27, 2022

(54) APPARATUS AND METHOD FOR THE NON-DESTRUCTIVE DETERMINATION OF THE CONTENT OF THE MAGNETIZABLE AND/OR NON-MAGNETIZABLE PORTION OF A SAMPLE

(71) Applicant: VOESTALPINE STAHL GMBH, Linz (AT)

(72) Inventors: Stefan Schuster, Enns (AT); Norbert Gstöttenbauer, Engerwitzdorf (AT); Christoph Thaler, Linz (AT); Daniel Wöckinger, Engerwitzdorf (AT)

(73) Assignee: VOESTALPINE STAHL GMBH, Linz (AT)

( * ) Notice: Subject to any disclaimer, the term of this patent is extended or adjusted under 35 U.S.C. 154(b) by 140 days.

(21) Appl. No.: 16/323,209

(22) PCT Filed: Aug. 2, 2017

(86) PCT No.: PCT/EP2017/069583
§ 371 (c)(1),
(2) Date: Feb. 4, 2019

(87) PCT Pub. No.: WO2018/024800
PCT Pub. Date: Feb. 8, 2018

(65) Prior Publication Data
US 2019/0170693 A1    Jun. 6, 2019

(30) Foreign Application Priority Data
Aug. 2, 2016 (EP) ..................... 16182466

(51) Int. Cl.
*G01N 27/72* (2006.01)
*G01R 33/04* (2006.01)
*G01R 33/12* (2006.01)

(52) U.S. Cl.
CPC ............ *G01N 27/72* (2013.01); *G01R 33/04* (2013.01); *G01R 33/045* (2013.01); *G01R 33/1223* (2013.01)

(58) Field of Classification Search
CPC .... G01N 27/72; G01N 27/82; G01N 27/9033; G01R 33/045; G01R 33/1223
See application file for complete search history.

(56) References Cited

U.S. PATENT DOCUMENTS 2,137,177 A * 11/1938 Melchior ............... G01R 33/14
                                                             324/239
2,755,433 A    7/1956 Lease et al.
(Continued)

FOREIGN PATENT DOCUMENTS

EP          0267896 A2    5/1988

*Primary Examiner* — Thang X Le

(57) ABSTRACT

An apparatus and method for the non-destructive determination of the content of the magnetizable and/or non-magnetizable portion of a sample, in which the sample is provided in an air gap of a magnetically conductive yoke, an alternating magnetic field is generated by an alternating magnetic field strength of an excitation coil in the yoke, and first measurement data relating to the sample are collected using a measuring device which is inductively coupled to the yoke, and comparing the first measurement data to second measurement data relating to a reference sample, wherein the same alternating magnetic field strength or the same alternating magnetic field is applied to both the reference sample and the sample and the difference between the two collected sets of measurement data is included as a measure in the determination of the content for the magnetizable and/or non-magnetizable content portion of the sample.

15 Claims, 4 Drawing Sheets

(56) References Cited

U.S. PATENT DOCUMENTS

| | | | |
|---|---|---|---|
| 3,337,795 A | | 8/1967 | Yamamoto et al. |
| 3,940,688 A | * | 2/1976 | Lazzari .................. G01R 33/12 324/243 |
| 4,394,193 A | | 7/1983 | Gfrerer |
| 5,296,802 A | * | 3/1994 | Beranger ............. G01R 15/148 324/117 R |
| 5,439,089 A | * | 8/1995 | Parker ...................... G07D 5/08 194/317 |
| 6,056,104 A | * | 5/2000 | Neubarth .................. G07D 1/02 194/317 |
| 7,405,555 B2 | * | 7/2008 | Rao ........................ G06K 1/125 324/201 |
| 2007/0299625 A1 | * | 12/2007 | Englert ................ A63B 63/004 324/207.11 |

\* cited by examiner

APPARATUS AND METHOD FOR THE NON-DESTRUCTIVE DETERMINATION OF THE CONTENT OF THE MAGNETIZABLE AND/OR NON-MAGNETIZABLE PORTION OF A SAMPLE

FIELD OF THE INVENTION

The invention relates to an apparatus and a method for the non-destructive determination of the content of the magnetizable and/or non-magnetizable portion of a sample, in which the sample is provided in an air gap of a magnetically conductive yoke, an alternating magnetic field is generated by means of an alternating magnetic field strength of an excitation coil in the yoke, and first measurement data relating to the sample are collected using at least one measuring device, which is inductively coupled to the yoke, and the magnetizable and/or non-magnetizable content portion in the sample is determined by comparing the first measurement data to second measurement data relating to a reference sample that has a known magnetizable and/or non-magnetizable content portion.

BACKGROUND OF THE INVENTION

There are non-destructive methods known from the prior art (EP0267896A2) that can be used to determine the magnetizable and/or non-magnetizable or ferromagnetic content portion of a sample. In these, the sample that is to be measured is provided in an air gap of a magnetically conductive yoke that is acted on with a particular alternating magnetic field strength by means of an excitation coil. The excitation coil is part of an electrical resonant circuit whose resonance frequency changes as a function of the magnetizable and/or non-magnetizable portion of the samples. At a measurement frequency of this resonant circuit, measurement current is sensed by a measuring device and is used to deduce the content of the magnetizable and/or non-magnetizable portion in the sample. A method of this kind, however, is relatively interference-prone and also requires a complex evaluation method—in particular because the magnetic permeability pi has a non-linear curve.

SUMMARY OF THE INVENTION

The object of the invention, therefore, is to improve a method of the type mentioned at the beginning in such a way that it is quicker to perform and is nevertheless highly reliable.

The invention attains the stated object with regard to the method in that during the collection of the first and second measurement data relating to the sample and the reference sample with the aid of the excitation coil, the same alternating magnetic field strength or the same alternating magnetic field is applied to both the reference sample and the sample and the difference between the two sets of collected measurement data is included as a measure in the determination of the content for the magnetizable and/or non-magnetizable content portion of the sample.

If, during the collection of the first and second measurement data relating to the sample and reference sample with the aid of the excitation coil, the same alternating magnetic field strength or the same alternating magnetic field is applied to both the reference sample and the sample, then despite the non-linear magnetic permeability p and its functional dependence on the magnetizable and/or non-magnetizable content portion, it is possible to obtain comparable measurement data from both the sample and the reference sample.

In a first variant, for example, this can be achieved by applying an alternating magnetic field strength with an identical signal curve over time (frequency and amplitude) to both the sample and the reference sample (e.g. by regulating the current i(t) of the excitation coil). In this case—with the assumption of a permeability of the yoke $\mu_J$ that is constant (in the measurement range)—the magnetic resistance $R_J$ thereof can also be assumed to be constant. The magnetic resistances of the reference sample $R_{ref}$ and the sample $R_p$ can thus be expressed as functions of the magnetomotive force $\Theta_E$ (generated by the excitation coil) and the magnetic flux $\Phi_{ref}$ in the reference sample and/or the magnetic flux $\Phi_p$ in the sample:

$$R_{ref} = \frac{\Theta_E(t)}{\Phi_{ref}(t)} - R_j \tag{1}$$

$$R_p = \frac{\Theta_E(t)}{\Phi_p(t)} - R_j \tag{2}$$

In a second variant, by applying the same alternating magnetic field B, it is possible to achieve the fact that at all times, the same magnetic flux $\Phi_p$ and/or $\Phi_{ref}$ is flowing through the sample, the reference sample, and the yoke ($\Phi_{ref}=\Phi_p$). The magnetic resistances of the reference sample $R_{ref}$ and the sample $R_p$ can thus in turn be expressed as functions of the magnetic flux $\Phi_p$ and/or $\Phi_{ref}$:

$$R_{ref} = \frac{\Theta_E(t)}{\Phi_{ref}(t)} - R_j(\Phi_{ref}(t)) \tag{3}$$

$$R_p = \frac{\Theta_E(t)}{\Phi_p(t)} - R_j(\Phi_{ref}(t)) \tag{4}$$

According to the invention, both variants then result in the fact that the influence of the yoke can be eliminated from the measurements. It is thus subsequently also possible to calculate a difference between the two sets of collected measurement data and to include this difference as a measure in the determination of the content for the magnetizable and/or non-magnetizable content portion of the sample.

By measuring the magnetic flux of the reference sample $\Phi_{ref}$ and the sample $\Phi_p$, it is specifically possible to determine the magnetizable content portion of the sample—when the magnetizable content portion of the reference sample is known—from the ratio of the magnetic resistances $R_{ref}$ and $R_p$ (by subtraction and transformation of the equations (2)-(1) and (4)-(3)). This achieves a simple evaluation method for comparing the measurement data of the sample and reference sample, which, among other things due to its mathematical simplicity, can enable a more reliable and simultaneously quicker determination of the magnetizable and/or non-magnetizable content portion of a sample.

If the alternating magnetic fields (B) are measured by means of a measuring device that is inductively coupled to the excitation coil via the yoke, then this can enable a direct determination of the magnetic flux density in the yoke. In this case, it is particularly preferable if the measuring device is embodied as a measuring coil coupled via the yoke. In this instance, the voltage V(t) that is induced in the measuring coil is integrated by means of an integrator in order to determine the value of the magnetic field strength (B). It is thus possible to achieve a simple and simultaneously reliable method.

If, during the determination of the content of the magnetizable and/or non-magnetizable content portion in the sample, the relative permeabilities of the sample and the reference sample are determined, then it is possible to determine a physically informative parameter, which reflects the magnetizable content of the sample. It is thus possible to achieve a reliable method.

In order to be able to deduce the iron content from the difference data in a particularly simple way, it can be advantageous if the relative permeability of the sample is modeled as the sum of the relative permeabilities of pure iron and air. In other words, the magnetic resistance of the sample and the reference sample can be modeled as a series circuit of a layer with a 100% iron content and a layer of air (with a 0% iron content). It is thus possible to calculate a simple relationship between the measurement data/difference data and the iron content, which can enable achievement of a not only quick but also reliable method. In general, it is noted that it can turn out to be advantageous if the magnetizable portion of the reference sample is of a magnitude similar to that of the magnetizable portion of the sample that is to be measured in order to thus increase the sensitivity/measurement precision of the apparatus. Preferably, the magnetizable portion of the reference sample is the average of the expected magnetizable portions of the samples that are to be determined.

The method can be implemented in a simple way from a process standpoint if the same alternating magnetic field strength is applied to the sample and the reference sample by regulating the coil current i(t) of the excitation coil. It is thus possible, for example, for a current i(t) that is equal in frequency and amplitude to travel through the excitation coil and to induce a defined alternating magnetic field strength in it. For this purpose, a current regulating device can be incorporated into the method in order to apply a defined current i(t) to the coil.

Alternatively, a reliable method can be achieved if the same alternating magnetic field is applied to the sample and the reference sample by regulating said field. This can take place, for example, by measuring the alternating magnetic field in a measuring coil, where the voltage that is induced into the measuring coil is supplied to an integrator, which in turn is connected to a controller in order to thus control the alternating magnetic field in the yoke.

In addition, if, during the measurement data collection, the operating point of the alternating field strength lies in the region of the flat curvature of the magnetic permeability of the yoke, then it is possible to achieve a particularly reliable method. In this case, it is particularly possible to further reduce the approximation error when assuming the existence of a constant permeability of the yoke.

Another object of the invention is to create an apparatus for quickly and reliably performing the method according to the invention. In addition, the apparatus should be able to determine the magnetizable and/or non-magnetizable content portion of the sample in a particularly exact way.

Because the apparatus has a first measuring coil, which is inductively coupled to the yoke and from which the measuring device collects measurement data, and because the apparatus has a regulating device that cooperates with the excitation coil in order to apply the same alternating magnetic field strength or the same alternating magnetic field to the first air gap for the reference sample or the sample, and because the apparatus has a differential circuit that is embodied for generating difference data from the measurement data relating to the reference sample and the sample, and because the apparatus has an evaluation device that is connected to the differential circuit and is embodied for determining the content of the magnetizable and/or non-magnetizable content portion in the sample (1) as a function of the difference data, it is possible by design to insure that the measurement data collected from the sample and from the reference sample are comparable—and that it is thus possible to exactly determine the magnetizable and/or non-magnetizable content portion of the sample.

In order to apply the same alternating magnetic field strength to the sample and the reference sample, it is also alternatively conceivable to embody an apparatus having a first magnetically conductive yoke that has a first air gap for receiving the sample, having a first measuring coil inductively coupled to the first yoke, having a second magnetically conductive yoke that has a second air gap for receiving a reference sample, having a second measuring coil inductively coupled to the second yoke, and having an excitation coil that is inductively coupled to both of the yokes. The determination of the content can be carried out with a measuring device, which collects first and second measurement data from the first and second measuring coils, with a differential circuit that is connected to the measuring device and is embodied for generating difference data from the measurement data relating to the reference sample and the sample, and with an evaluation device that is connected to the differential circuit and is embodied for determining the content of the magnetizable and/or non-magnetizable content portion in the sample as a function of the difference data.

Alternatively, it is also conceivable to embody an apparatus having a magnetically conductive yoke that has a middle piece and two side legs adjoining it, each with a respective air gap, in which the first air gap is embodied for the insertion of a reference sample that has a ferromagnetic material portion and the second air gap is embodied for the insertion of the sample, having at least one excitation coil provided on the middle piece of the yoke and having at least one first and second measuring coil provided on each leg, which coils are inductively coupled to the associated excitation coil via the yoke. It is thus possible—embodied in a simply designed way—to insure that the same alternating magnetic field strength is applied to the sample and the reference sample. It is thus possible to carry out the difference calculation of the measurement data of the sample and reference sample, namely with a measuring device that collects first and second measurement data from the first and second measuring coils, and with a differential circuit that is connected to the measuring device and is embodied for generating difference data from the measurement data relating to the reference sample and the sample. Embodied in a simply designed way, it is then possible to use an evaluation device that is connected to the differential circuit and is embodied for determining the content of the magnetizable and/or non-magnetizable content portion in the sample as a function of the difference data to analyze the sample based on the reference sample in a precise and non-destructive way.

The design of the apparatus can be further simplified if the differential circuit for generating difference data electrically connects the two measuring coils in series.

The precision of the apparatus can be further increased if, during the measurement data collection, the operating point of the alternating field strength of the excitation coil lies in the region of the flat curvature of the magnetic permeability of the yoke.

BRIEF DESCRIPTION OF THE DRAWINGS

In the figures, the subject of the invention is shown in greater detail based on an embodiment variant serving as an example. In the drawings.

DETAILED DESCRIPTION OF THE PREFERRED EMBODIMENTS

Figure 1:
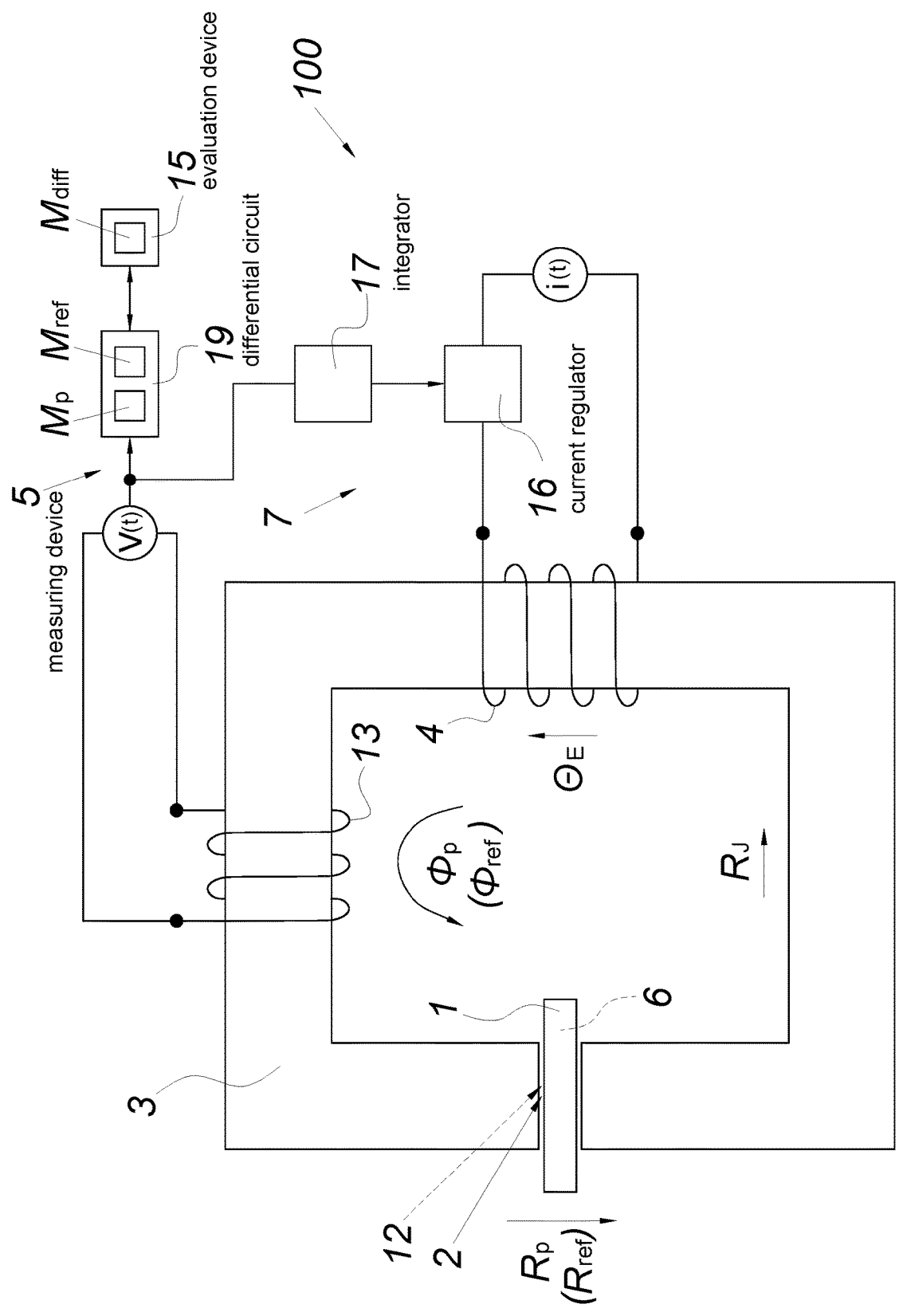
FIG. 1 shows an apparatus for carrying out the method according to the invention.

FIG. 1 shows an apparatus 100 for carrying out the method according to the invention for the non-destructive determination of the content of the magnetizable and/or non-magnetizable portion of a sample 1.

In this case, the sample 1 is positioned in an air gap 2 of a magnetically conductive yoke 3. By means of the excitation coil 4, the yoke 3 is acted on with a magnetic field strength H, which induces a magnetomotive force $\Theta_E$ into the coil and produces an alternating magnetic field B or a magnetic $\Phi_{ref}$ and/or $\Phi_p$ in the yoke 3—and thus also in the sample 1.

A measuring device 5 is in turn inductively coupled to the yoke 3 and is thus able to collect measurement data $M_p$ relating to the sample 1. First measurement data $M_p$ relating to the sample 1 that are collected in this way are then compared to second measurement data $M_{ref}$ relating to a reference sample 6, which are measured with the same apparatus 1. In addition, the magnetizable and/or non-magnetizable content portion of the reference sample 6 is known.

In order to then produce comparable measurement data $M_p$, $M_{ref}$ between the reference sample 6 and the sample 1, it is proposed according to the invention to always apply the same alternating magnetic field strength H to the sample 1 and the reference sample 6. For this purpose, a control loop 7 is provided, which has a current regulator 16 and thus applies an alternating current i(t) in such a way that the sample 1 and reference sample 6 are acted on with the same alternating magnetic field strength H.

Alternatively, with the aid of the control loop 7, the same alternating magnetic field B can be applied to the sample 1 and the reference sample 6, which is depicted with dashed lines in FIG. 1. In order to achieve this, the induced voltage V(t) is measured in a measuring coil 13 and is supplied to an integrator 17, which calculates the alternating field B. The result of the integrator 17 is then in turn supplied to the current regulator 16, which insures that the desired alternating magnetic field prevails in the yoke 3.

According to the invention, the same alternating magnetic field strength H is thus respectively applied to the sample 1 and reference sample 6 and the measuring device 5 measures the alternating magnetic fields B. For this purpose, the respective complementary value (B or H) is collected by the measuring device 5 and the collected measurement data $M_p$, $M_{ref}$ are supplied to a differential circuit 19—and are stored there for the difference calculation. To determine the magnetizable and/or non-magnetizable content portion in the sample 1, the differential circuit 19 then calculates the difference between these measurement data $M_p$, $M_{ref}$ that are measured one after the other and the difference data $M_{diff}$ are generated—and are supplied to the evaluation device 15, which uses these difference data $M_{diff}$ as a measure in the determination of the content for the magnetizable and/or non-magnetizable content portion of the sample 1. In other words, based on the difference between the alternating magnetic fields $B_{ref}$ and $B_p$, it is possible to deduce the content portion of magnetizable and/or non-magnetizable material in the sample.

Figure 2:
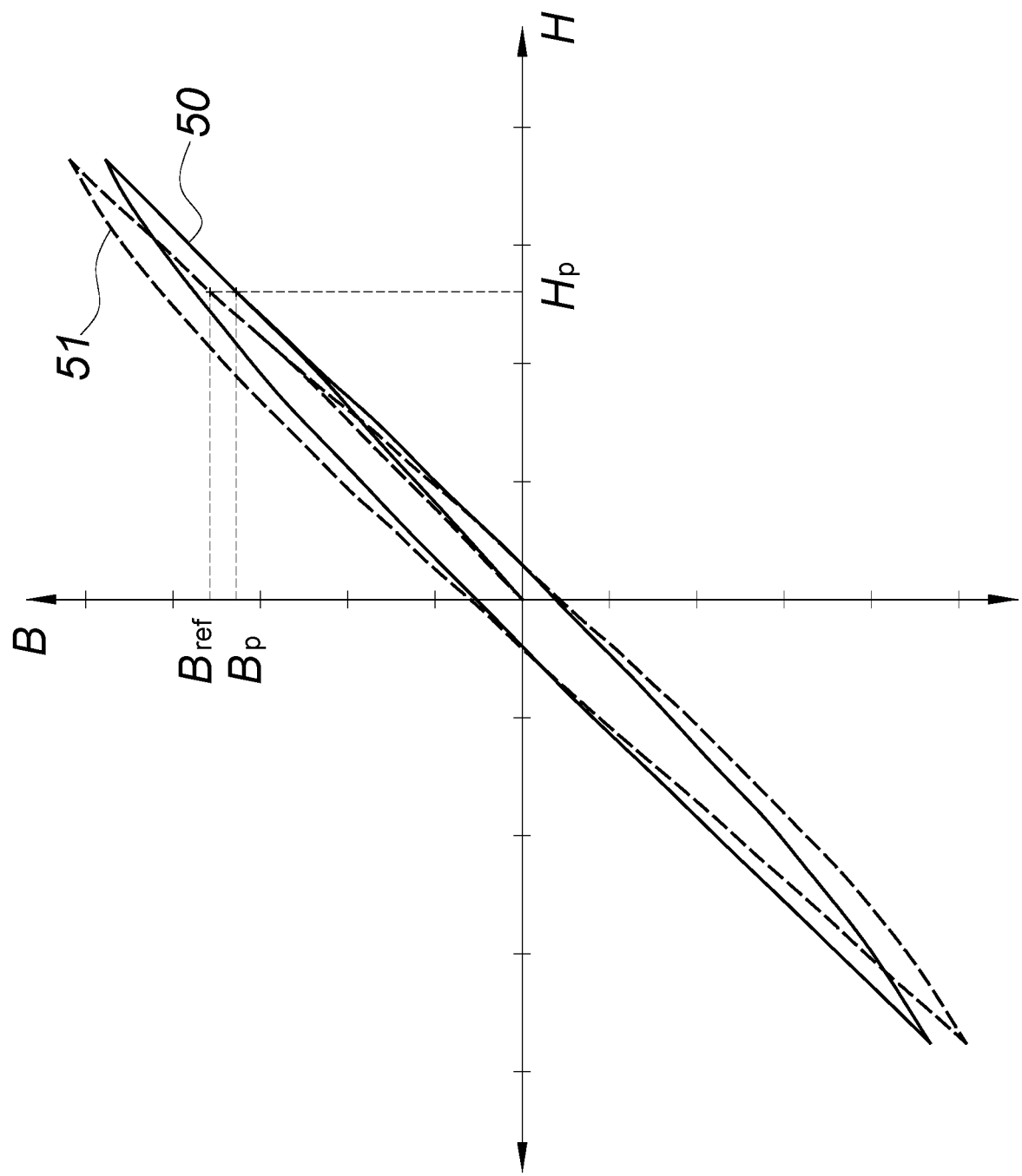
FIG. 2 is a graphic depiction of the magnetization curves in the measurement method.

FIG. 2 shows the result of such a measurement. In this case, identical alternating field strengths H have been applied to the sample 1 and reference sample 6 and a hysteresis loop 50 of the sample and a hysteresis loop 51 of the reference sample have been recorded by the measuring device 5. At a point $H_p$ of identical field strengths, the two hysteresis loops 50, 51 can then have different magnetic fields $B_p$ and $B_{ref}$. Based on the difference between the magnetic field strengths, it is then possible, for example, to deduce the content portion of magnetizable material in the sample 1—since the content portion of magnetizable material in the reference sample 6 is known. The equivalent consideration can be carried out for the non-magnetizable content portion. In this case, it can turn out to be particularly advantageous if the measurement data $M_{ref}$, $M_p$ are recorded in the flat region of the curve of the magnetic permeability $\mu_J$ of the yoke and are used for the evaluation since it can then be assumed to be virtually constant and is thus eliminated from the difference calculation of the magnetic fields. To accomplish this, during the measurement data collection, the operating point of the alternating field strength H of the excitation coil 4 lies in the region of the flat curve of the magnetic permeability of the yoke 3, 30; this applies to all of the embodiment variants. Based on the difference between the magnetic field strengths, it is thus possible to deduce the change in the relative permeability $\mu_r$ between the sample and the reference sample.

Alternatively, however, it is also possible, during the measurement data collection, to apply identical alternating magnetic fields B to the sample 1 and reference sample 6. The measuring device 5 therefore collects the field strengths H in the same respective magnetic field B in the sample 1 and reference sample 6. Exemplary measurement data $M_{ref}$, $M_p$ for this method step, however, are not shown in the figures.

Figure 3:
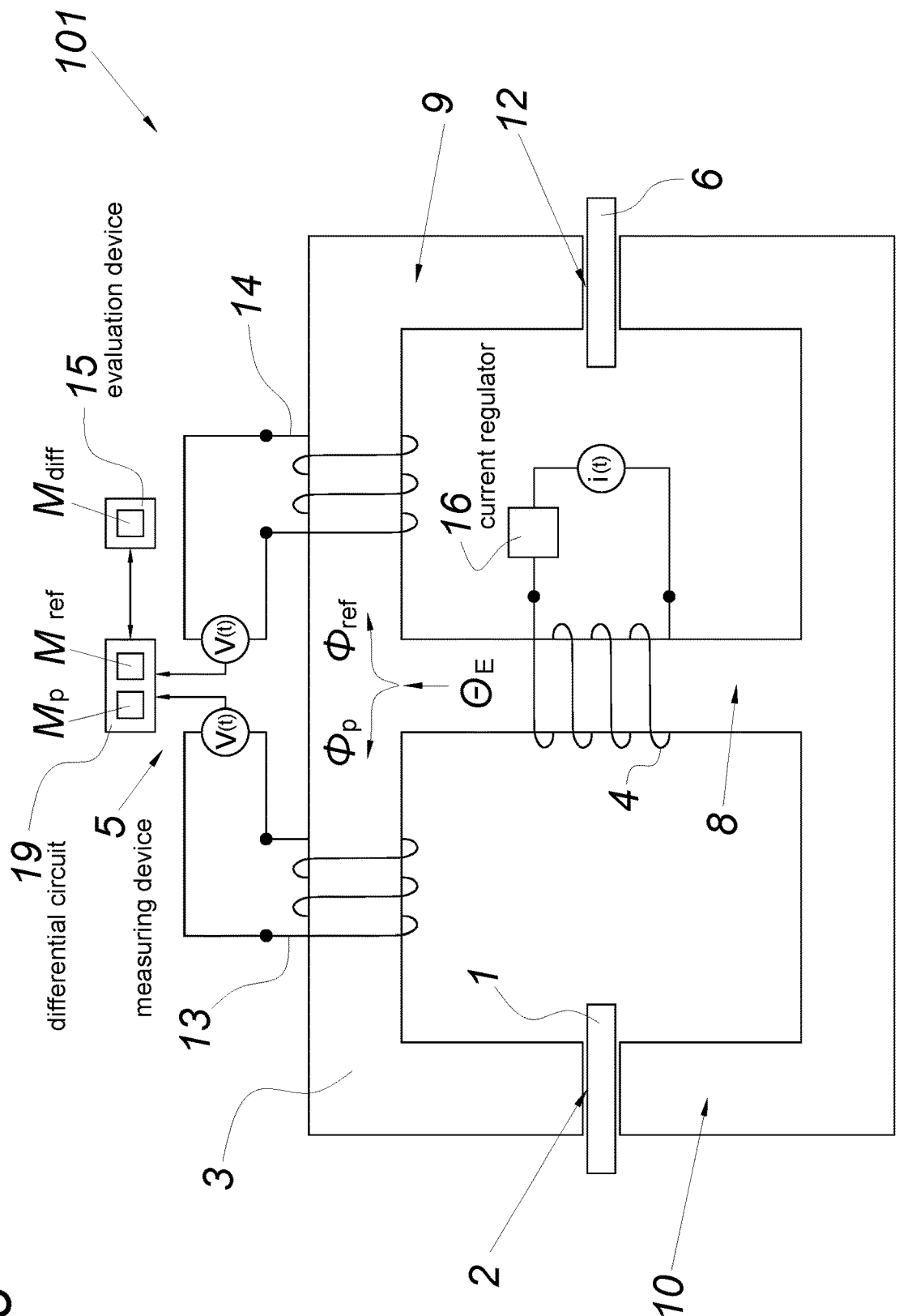
FIG. 3 shows another apparatus for carrying out the method according to the invention.

FIG. 3 shows an alternative apparatus 101 for carrying out the measurement method, having a magnetically conductive yoke 3 that has a middle piece 8 and two side legs 9, 10 adjoining it. The two legs 9, 10 each have an air gap 2, 12—the first air gap 2 is embodied for the insertion of the sample 1 and the second air gap 12 is embodied for the insertion of the reference sample 6. The magnetizable content portion of the reference sample 6 is known in this case. On the middle piece 8 of the yoke 3, an excitation coil 4 is provided while on the two legs 9, 10, a first and second measuring coil 13, 14 are provided, which are inductively coupled to the yoke 3. A measuring device 5 in this case collects first measurement data from the first measuring coil 13—i.e. from the sample 1—and second measurement data from the second measuring coil 14—i.e. from the reference sample 6.

The measuring device 5 generates difference data $M_{diff}$ based on the first and second sets of measurement data and is in turn connected to an evaluation device 15, which uses the difference data $M_{diff}$ to determine the magnetizable and/or non-magnetizable content portion.

Figure 4:
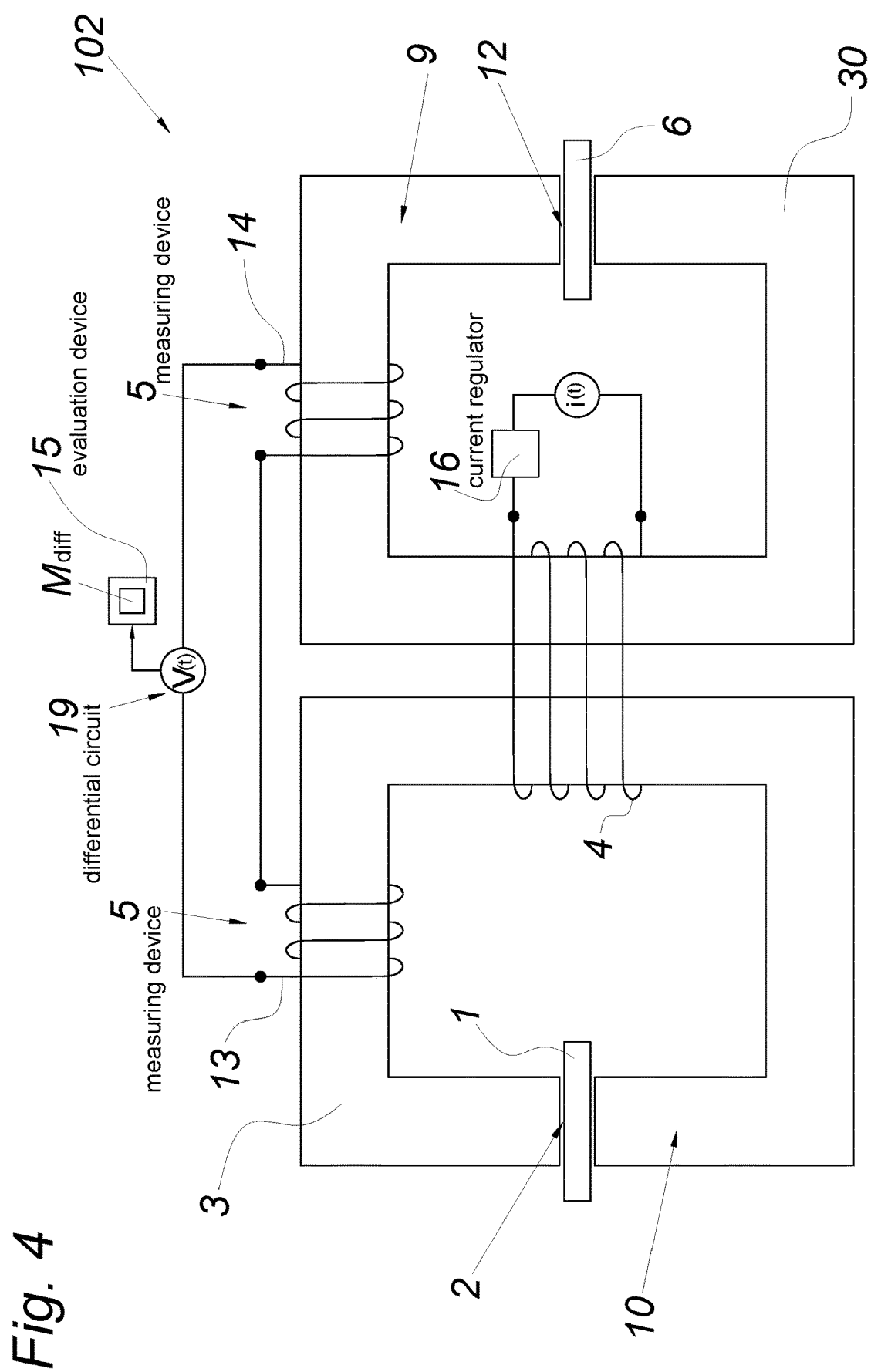
FIG. 4 shows a third apparatus for carrying out the method according to the invention.

In another embodiment, however, the measuring coils 13, 14 of the measuring device 5 can also be connected in series, as is shown by way of example for the apparatus 102 according to FIG. 4. Based on this wiring, it is possible through subtraction of the induction voltages V(t) in the measuring coils 13, 14 to simultaneously also embody a simply designed differential circuit 19. The apparatus 102 shown in FIG. 4 also differs from the one shown in FIG. 3 in that in FIG. 3, two yokes 3, 30 are shown instead of a single yoke 3. These yokes 3, 30 each have a respective measuring coil 13, 14 and a respective air gap 2, 12. In order to apply the same alternating magnetic field strength to the two yokes 3, 30 according to the invention, the excitation coil 4 is inductively coupled to the two yokes 3, 30—see FIG. 4. This design of the apparatus 102 makes it possible for a yoke 3, 30 to be replaced, thus making the apparatus 102 easier to maintain.

The invention claimed is:

1. A method for the non-destructive determination of the content of the magnetizable and/or non-magnetizable portion of a sample, comprising:
   providing the sample in an air gap of a magnetically conductive yoke;
   generating an alternating magnetic field B using an alternating magnetic field strength H of an excitation coil in the yoke;
   collecting first measurement data relating to the sample using at least one measuring device which is inductively coupled to the yoke; and
   determining the magnetizable and/or non-magnetizable content portion in the sample by comparing the first measurement data to second measurement data relating to a reference sample that has a known magnetizable and/or non-magnetizable content portion,
   wherein during the collection of the first and second measurement data relating to the sample and the reference sample with the aid of the excitation coil, either:
   the same alternating magnetic field strength H is applied to both the reference sample and the sample, in which case a difference between the two collected sets of measurement data based on the different magnetic fields B of the reference sample and the sample is included as a measure in the determination of the content for the magnetizable and/or non-magnetizable content portion of the sample,
   or
   the same alternating magnetic field B is applied to both the reference sample and the sample, in which case a difference between the two collected sets of measurement data based on the different magnetic field strengths H of the reference sample and the sample is included as a measure in the determination of the content for the magnetizable and/or non-magnetizable content portion of the sample.

2. The method according to claim 1, comprising measuring the alternating magnetic field B using the at least one measuring device with a measuring coil that is inductively coupled to the excitation coil via the yoke.

3. The method according to claim 1, wherein when determining the content portion of the magnetizable and/or non-magnetizable portion in the sample, the relative permeability of the sample and the reference sample are determined.

4. The method according to claim 1, wherein a relative permeability of the sample is modeled as a sum of relative permeabilities of pure iron and air.

5. The method according to claim 1, comprising applying the same alternating magnetic field strength H to the sample and the reference sample by regulating a coil current of the excitation coil.

6. The method according to claim 1, comprising applying the same alternating magnetic field B to the sample and the reference sample by regulating said alternating magnetic field B.

7. The method according to claim 1, wherein during the collection of the first and second measurement data, an operating point of the alternating field strength H lies in a region of a flat curvature of a magnetic permeability of the yoke.

8. An apparatus for carrying out the method for the non-destructive determination of the content of the magnetizable and/or non-magnetizable portion of a sample according to claim 1, the apparatus comprising:
   the first magnetically conductive yoke that has the first air gap for selectively receiving the sample or the reference sample;
   the excitation coil provided on the yoke;
   the at least one measuring device inductively coupled to the yoke;
   an evaluation device connected to the at least one measuring device, for determining the content of the magnetizable and/or non-magnetizable content portion of the sample;
   a first measuring coil, which is inductively coupled to the yoke, from which the at least one measuring device collects the first measurement data;
   a regulating device that cooperates with the excitation coil in order to apply the same alternating magnetic field strength H or the same alternating magnetic field B in the first air gap for the reference sample or the sample; and
   a differential circuit for generating difference data from the first measurement data relating to the sample and the second measurement data relating to the reference sample;
   wherein the evaluation device is connected to the differential circuit for determining the content of the magnetizable and/or non-magnetizable content portion in the sample as a function of the difference data.

9. An apparatus for carrying out the method for the non-destructive determination of the content of the magnetizable and/or non-magnetizable portion of a sample according to claim 1, the apparatus comprising:
   the first magnetically conductive yoke that has the first air gap for receiving the sample;
   a first measuring coil inductively coupled to the first yoke;
   a second magnetically conductive yoke that has a second air gap for receiving the reference sample;
   a second measuring coil inductively coupled to the second yoke;
   the excitation coil inductively coupled to both of the first and second yokes;
   the at least one measuring device that collects first and second measurement data from the first and second measuring coils;
   a differential circuit connected to the at least one measuring device for generating difference data from the measurement data relating to the reference sample and the sample; and
   an evaluation device connected to the differential circuit for determining the content of the magnetizable and/or non-magnetizable content portion in the sample as a function of the difference data.

10. An apparatus for carrying out the method for the non-destructive determination of the content of the magnetizable and/or non-magnetizable portion of a sample according to claim 1, the apparatus comprising:

the magnetically conductive yoke that has a middle piece and two side legs adjoining the middle piece, each with the respective air gap, wherein a first air gap is embodied for insertion of the sample and a second air gap is embodied for insertion of the reference sample;

at least one of the excitation coils provided on the middle piece of the yoke and having at least one first and second measuring coil that are provided on each of the two side legs and are inductively coupled to the yoke;

the at least one measuring device that collects measurement data from the first and second measuring coils;

a differential circuit connected to the at least one measuring device for generating difference data from the measurement data relating to the reference sample and the sample; and an evaluation device connected to the differential circuit for determining the content of the magnetizable and/or non-magnetizable content portion in the sample as a function of the difference data (WHO.

11. The apparatus according to claim 9, wherein the differential circuit for generating difference data electrically connects the first and second measuring coils in series.

12. The apparatus according to claim 8, wherein during the collection of the first and second measurement data, an operating point of the alternating field strength H of the excitation coil lies in a region of a flat curvature of a magnetic permeability of the yoke.

13. The apparatus according to claim 10, wherein the differential circuit for generating difference data electrically connects the first and second measuring coils in series.

14. The apparatus according to claim 9, wherein during the collection of the first and second measurement data, an operating point of an alternating field strength of the excitation coil lies in a region of a flat curvature of a magnetic permeability of the yokes.

15. The apparatus according to claim 10, wherein during the collection of the first and second measurement data, an operating point of an alternating field strength of the at least one excitation coil lies in a region of a flat curvature of a magnetic permeability of the yoke.

* * * * *

UNITED STATES PATENT AND TRADEMARK OFFICE
CERTIFICATE OF CORRECTION

PATENT NO. : 11,536,692 B2
APPLICATION NO. : 16/323209
DATED : December 27, 2022
INVENTOR(S) : Stefan Schuster et al.

It is certified that error appears in the above-identified patent and that said Letters Patent is hereby corrected as shown below:

In the Specification

Column 1, Line 43, "pi" should read --µ--.

Column 1, Line 66, "p" should read --µ--.

Column 2, Line 20, "Rj" should read --RJ--.

Column 2, Line 23, "Rj" should read --RJ--.

Column 2, Line 35, "Rj" should read --RJ--.

Column 2, Line 38, "Rj" should read --RJ--.

In the Claims

Column 9, Claim 10, Line 19, "(WHO" should read --(Mdiff)--.

Signed and Sealed this
Eighth Day of August, 2023

Katherine Kelly Vidal
*Director of the United States Patent and Trademark Office*